(12) United States Patent
Bae et al.

(10) Patent No.: US 7,038,360 B2
(45) Date of Patent: May 2, 2006

(54) PASSIVE APPARATUS THAT REGULATES A FLOW OF HEATED AIR WITHIN A PLASMA DISPLAY DEVICE

(75) Inventors: Sung-Won Bae, Cheonan (KR); Ho-Chul Ryu, Seoul (KR)

(73) Assignee: Samsung SDI Co., Ltd., Suwon-si (KR)

( * ) Notice: Subject to any disclaimer, the term of this patent is extended or adjusted under 35 U.S.C. 154(b) by 236 days.

(21) Appl. No.: 10/644,014

(22) Filed: Aug. 20, 2003

(65) Prior Publication Data

US 2004/0036413 A1 Feb. 26, 2004

(30) Foreign Application Priority Data

Aug. 22, 2002 (KR) .................. 10-2002-0049757

(51) Int. Cl.
*H01J 17/49* (2006.01)
(52) U.S. Cl. .......................... 313/46; 313/582
(58) Field of Classification Search ........... 361/688, 361/690, 692, 693, 697, 678, 752, 708; 313/582–587, 313/46; 315/169.4
See application file for complete search history.

(56) References Cited

U.S. PATENT DOCUMENTS

| | | | |
|---|---|---|---|
| 5,831,374 A | * | 11/1998 | Morita et al. .................. 313/46 |
| 6,198,222 B1 | * | 3/2001 | Chang ........................ 313/582 |
| 6,288,489 B1 | * | 9/2001 | Isohata et al. .............. 313/582 |
| 6,373,702 B1 | * | 4/2002 | Oishi et al. .................. 361/704 |
| 6,633,126 B1 | * | 10/2003 | Tsai et al. .................... 313/582 |
| 6,744,186 B1 | * | 6/2004 | Oishi et al. .................... 313/46 |
| 6,833,674 B1 | * | 12/2004 | Kaneko et al. ............. 313/587 |
| 6,882,108 B1 | * | 4/2005 | Kim et al. .................. 313/582 |
| 2002/0153840 A1 | * | 10/2002 | Isohata et al. .............. 313/582 |
| 2002/0159240 A1 | * | 10/2002 | Watanabe et al. ........... 361/752 |
| 2004/0027073 A1 | * | 2/2004 | Nomoto et al. ............. 313/583 |
| 2004/0036396 A1 | * | 2/2004 | Kang et al. ............ 313/231.31 |

FOREIGN PATENT DOCUMENTS

| | | | |
|---|---|---|---|
| CN | 1075324 C | | 11/2001 |
| JP | 11242442 A | * | 9/1999 |
| JP | 2001-282114 | | 12/2000 |
| JP | 2001-83888 | | 3/2001 |

\* cited by examiner

*Primary Examiner*—Karabi Guharay
(74) *Attorney, Agent, or Firm*—Robert E. Bushnell, Esq.

(57) ABSTRACT

A plasma display device that uses a plasma display panel to enable use as an image device such as a television. The plasma display device includes a plasma display panel, a chassis base including a circuit assembly for driving the plasma display panel and regulating members mounted in a vicinity of the circuit assembly on a surface of the chassis base to which the circuit assembly is provided, said regulating members regulating the flow of air in the area of the chassis base.

21 Claims, 9 Drawing Sheets

PASSIVE APPARATUS THAT REGULATES A FLOW OF HEATED AIR WITHIN A PLASMA DISPLAY DEVICE

CLAIM OF PRIORITY

This application makes reference to, incorporates the same herein, and claims all benefits accruing under 35 U.S.C. §119 from an application for PLASMA DISPLAY DEVICE earlier filed in the Korean Intellectual Property Office on Aug. 22, 2002 and there duly assigned Ser. No. 2002-49757.

BACKGROUND OF THE INVENTION

1. Field of the Invention

The present invention relates to a plasma display device, and more particularly, to a passive apparatus that manipulates the flow of heated air within a plasma display device preventing parts of the display panel and any air from reaching an extremely high temperature during the functioning of the plasma display device.

2. Description of the Related Art

It is well known that heat is generated in a plasma display panel (PDP) of a plasma display device during the functioning of the PDP. Especially in today's more modern PDP's, the amount of gas discharge may be increased in the PDP to improve brightness, thereby producing even more heat. As components within a plasma display device heat up, the surrounding air is heated. The heated air then rises in the space between the display and the circuit components to the top of the plasma display device where it then emerges out from the top of the plasma display device.

Therefore, in plasma display devices, the PDP is mounted to a chassis base that is formed of a material having good heat conductibility, and a heat-spreading sheet (or thermal conduction sheet) is interposed between the PDP and the chassis base. The heat generated in such a PDP is transmitted through the heat-spreading sheet and chassis base to outside the device. The chassis base is made of a metal such as aluminum and is produced using a die casting process, and the heat-spreading sheet is made of a silicone-based resin.

In addition to the heat generated in the PDP, heat is also produced in various drive circuits (e.g., an X,Y board, an image processing board, a switching mode power supply, etc.), which are mounted to one side of the chassis base. Therefore, in order to ensure a high quality device, it is necessary to prevent an increase in the internal temperature of the plasma display device by the heat generated as a result of the drive circuits.

Different configurations have been disclosed with such a purpose. For example, in Japanese Laid-Open Patent No. 2001-83888, a heat transmission element realized through a heat pipe or heat sink is used to cool the plasma display device. Also, in Japanese Laid-Open Patent No. 2001-282114, differences in temperature between a display section and a non-display section of a PDP, or between the non-display section and external electrodes are reduced using heat pipes.

However, with the use of separate elements such as heat pipes and heat sinks to dissipate the heat in the plasma display device, although some degree of cooling can be expected through such elements, heat generated at specific areas of the plasma display device can reach excessively high temperatures. The flow of hot air rises from the area of heat generation as a result of natural convection current characteristics, and in most plasma display devices including those described above, the hot air that has traveled upward from the area of heat generation simply exits the device. This may pose safety risks to users considering that the drive circuits (e.g., the switching mode power supply board or SMPS board) operate at temperatures of up to 90° C. Unless the air heated by such circuit elements is cooled or dispersed before exiting from the plasma display device, the hot air emerging from such components can harm a user that should happen to touch the plasma display panel or should happen to place the user's hands in the vicinity of where the hottest air exits from the inside of the plasma display device. In other words, if the convective air currents within a functioning plasma display device are not managed properly, certain portions on the upper edge of the plasma display device and air emerging from these certain portions on the upper edge of the plasma display device can reach excessively high temperatures and thus cause a safety hazard to users who may come into close contact with the plasma display device. Especially immediately above a high heat generating component such as the switching mode power supply, the air rising and exiting the plasma display device can be extremely hot. However, at the same time, portions along the upper edge of the plasma display device that are not situated directly above heat producing components can be very cool. Thus, along the top edge of the plasma display device, there are cool portions and very hot portions, depending on what circuit components lie directly below. In addition, the air emerging from the top edge of the plasma display device varies in temperature along the top edge. There are parts of the top edge where very hot air emerges and other portions along the top edge where relatively cool air emerges. This temperature disparity along the top edge of the plasma display device, especially when certain portions of the top edge are dangerously hot, needs to be moderated.

Therefore, there is a need to effectively, safely and efficiently control the air flow inside the plasma display device so that pockets and currents of extremely hot air do not exit the device and pose a threat to users. Also, there is a need to control the convective air currents within a functioning plasma display device so that portions along an upper edge of the plasma display panel to not reach excessively high temperatures and pose a safety threat to users of the plasma display device.

SUMMARY OF THE INVENTION

It is therefore an object of the present invention to provide an improved design for a plasma display device.

It is yet another object of the present invention to provide designs for a plasma display device that better manages the air currents within the device in such a manner that prevents a user in the vicinity of the device or a user that touches the device from being burned or harmed by extreme heat.

It is further an object of the present invention to moderate the temperature of extremely hot air generated within a functioning plasma display prior to when the air exits the plasma display.

It is still another object of the present invention to force extremely hot air generated within a functioning plasma display device to mix with cooler air within the functioning plasma display device to produce air of a more moderate temperature prior to when the air exits the plasma display device.

It is also an object of the present invention to provide passive air guides within a plasma display device that mix very hot currents of air with cooler air within the plasma display device prior to when the air emerges from an inside of the plasma display device to prevent extremely hot air from emerging from a functioning plasma display device.

It is still another object of the present invention to provide a plasma display device that allows very hot heated air to mix with cooler air prior to emerging from the inside of the device such that there is no extremely hot air current emerging from the functioning device.

These and other objects can be accomplished by having passive regulating members (or partitions or barriers or strips) disposed in the plasma display device to guide rising hot air within the device and force or induce the rising hot air to mix with cooler air before emerging from an inside of the functioning plasma display device through an upper edge of the functioning plasma display device. Preferably, these partitions or barriers or strips or regulators are attached to the circuit board and form an angle, often perpendicular to the circuit board and the display. These partitions, barriers, strips or regulators serve to force the rising hot air to move in a lateral direction (perpendicular to the direction that hot air rises and parallel to the surface of the PDP). By forcing the hot air to move laterally prior to its emergence from the plasma display device, the extremely hot air can then be moderated in temperature by mixing with cooler air within the plasma display device before emerging from within the plasma display device at a top edge of the plasma display device.

Inside the plasma display device is a chassis base or a circuit board disposed between the plasma display and the rear cover. This chassis base or circuit board has several circuit components mounted thereon, including the drive circuits. These circuit components generate varying amounts of heat during functioning. These heated circuit components then heat up air surrounding the circuit components, the heated air being disposed in a space between the circuit board and the rear cover. The heated air then rises within the plasma display device in the space between the rear cover and the circuit board.

Some circuit components heat up surrounding air by a small amount and other circuit components heat up surrounding air to a very high temperature. And other portions of the circuit board do not heat up the surrounding air at all or by very little. By having regulating members or partitions or barriers or strips disposed on the circuit board on a side of the circuit board that faces the rear cover, and by having these regulating members near the top edge of the plasma display device, the regulating members can force the hottest air generated to mix with cooler air before emerging through the upper edge of the plasma display device, thus preventing air of an extremely high temperature from exiting from the top edge of a functioning plasma display device.

These regulators or partitions are strategically positioned near the top edge (i.e., laterally) of the circuit board to push a hot air current above a heat generating circuit component to the side to force the hot air to then mix with cooler air before emerging from the inside of the functioning plasma display device. Therefore, in one embodiment of the present invention, the regulator or partition is a mere barrier that is curved downward towards a heat generating circuit component to push the hot air current generated by the heat generating circuit element to both sides of the barrier to force the hot air to move in a lateral direction to cause the hot air to mix with cooler air before reaching the top edge of the plasma display device. This curved portion of this partition is called a convex portion of the partition as it is convex from a location beneath the barrier where the heat producing circuit element is located. These partition members are not continuous in the first embodiment. In places along the top edge of the circuit board that are not above heat generating circuits, there are gaps between adjacent partitions to let the hot air mixed with the cool air to escape out through the top edge of the plasma display device. Since the hot air is mixed with cooler air before exiting from an inside of the functioning plasma display device, the exiting air is not subject to the extremes in temperature found in functioning plasma display devices that are absent of these guiding partitions.

In a second embodiment of the present invention, the barrier is a straight and continuous and does not have any curved portions as in the first embodiment. In addition, in the second embodiment, the barrier runs in a lateral direction the entire width of the plasma display device. The barrier is disposed parallel to and is disposed near the top edge of the plasma display device. The barrier is perforated by small holes only at locations on the barrier that are not above extreme heat generating circuitry. At other portions of the barrier, especially portions of the barrier that is above extreme heat producing circuitry, the barrier is solid, without perforating holes. Therefore, during the functioning of a plasma display device according to the second embodiment of the present invention, when hot air produced by heat producing circuitry rises within the plasma display device, before exiting the device, the hot air runs into a solid portion of the barrier that is absent perforations. This forces the hot air to move sideways or laterally, to the left or right to then mix with cooler air thus moderating the extremely hot air. After the hot air moves sideways and cools by mixing with cooler air, the air can then escape upwards through a perforated portion of the barrier and then emerge from a top edge of the plasma display device. In the second embodiment, it is preferred that the portions of the barrier that is perforated has approximately 80% of the surface area being open and the remaining 20% being solid between the perforations.

In a third embodiment, the barrier is similar to the second embodiment except that the solid portions are replaced with lightly perforated portions where only 20% of the surface area is open. Thus, in the third embodiment, although a small amount of very hot rising air above a hot circuit element is allowed to pass through the lightly perforated barrier, most of the hot air is forced to move left or right in a sideways or lateral direction and mix with cooler air and then move through the heavily perforated portion of the barrier prior to emerge from a top edge of the functioning plasma display device.

In a fourth embodiment of the present invention, the plasma display device includes two partition or barrier strips, the partition or barrier strips being similar to that of the second embodiment of the present invention. The two partition strips are spaced apart from each other in a direction (+Y direction) parallel to the direction of rising hot air. Both strips are parallel to each other and to the top edge of the plasma display device. Both strips are near the top edge of the plasma display device. Like the second embodiment, one of the strips has perforations only at portions on the strip above portions of the circuit board that is absent of heat generating circuitry or where the circuitry beneath generates relatively little heat. The second partition strip has perforations at locations that are offset or staggered from the locations of perforations on the first strip.

In a fifth embodiment of the present invention, the fifth embodiment is similar to the third embodiment except that there are two partition strips extending the width of the plasma display device. Both strips are parallel to each other and both are parallel to and located near a top edge of the plasma display device. The strips are displaced from each other in a direction parallel to the direction of rising hot air in a functioning plasma display device. The lower strip is identical to that of the third embodiment while the upper strip has heavily perforated portions at locations displaced or staggered in a left or right direction to the heavily perforated portions on the lower strip to provide for more thorough mixing of hot and cool air prior to when the air emerges from the top edge of the plasma display panel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
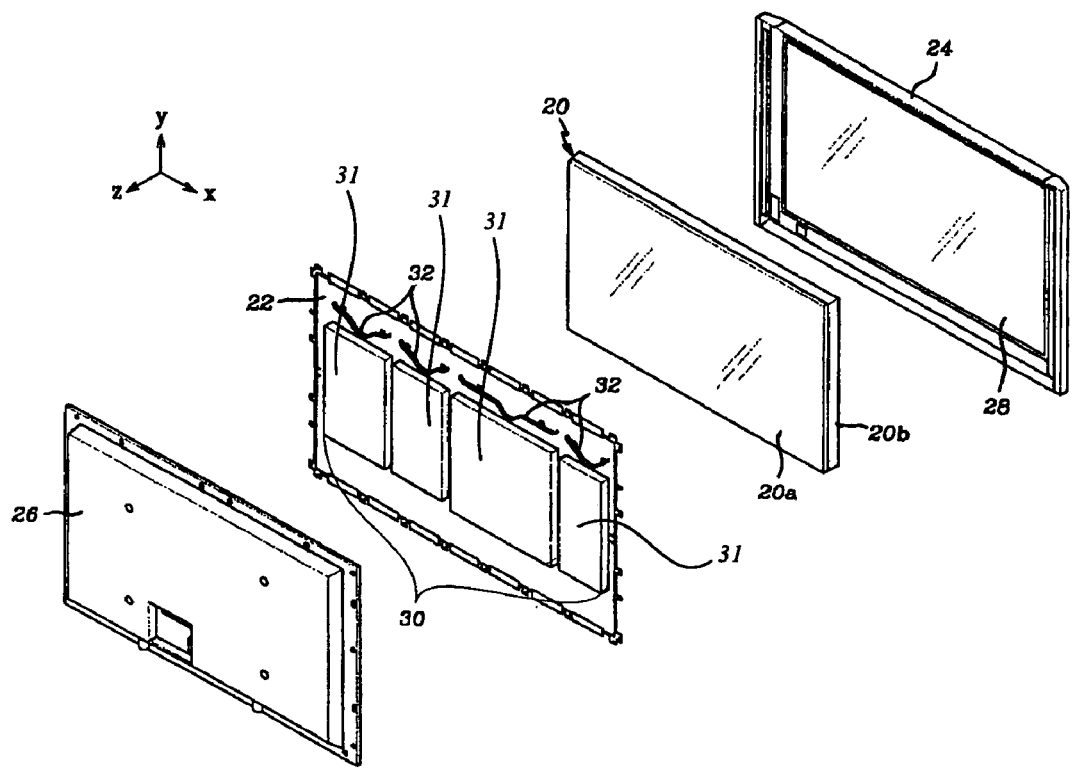
FIG. 1 is an exploded perspective view of a plasma display device according to a first preferred embodiment of the present invention.

Turning to the figures, FIG. 1 is an exploded perspective view of a plasma display device according to a first preferred embodiment of the present invention. As illustrated in FIG. 1, the plasma display device includes a plasma display panel (PDP) 20 for realizing images, an exterior of the PDP 20 being defined by two glass substrates 20a and 20b a chassis base (or circuit board) 22 provided to a side of the PDP 20 opposite the side of the PDP 20 for realizing images and mounted in this state; a front cover 24 provided to a side of the PDP 20 that realizes images, and a back cover 26 mounted to a side of the chassis base 22 opposite to the side of the chassis base that is closest to the PDP 20.

A heat conducting medium (not illustrated) is interposed between the PDP 20 and the chassis base 22. The heat conducting medium transmits heat generated by the PDP 20 to the chassis base 22. Also, a filter 28 is mounted in an opening of the front cover 24 that exposes most of the PDP 20. The filter 28 blocks electromagnetic waves irradiated from the PDP 20.

An exterior of the PDP 20 is substantially quadrilateral (in the first preferred embodiment, it is rectangular with long sides in a lateral or X axis direction). An outer circumference of the chassis base 22 substantially corresponds to the shape of the PDP 20. The chassis base 22 is made of a material such as aluminum that has excellent thermal conduction characteristics. A circuit assembly 30 is mounted to the side of the chassis base 22 opposite to the side of the chassis base that is closest to the PDP 20. Circuit assembly 30 may be comprised of many circuit elements. Each circuit element 31 can be a separate circuit board attached to the chassis base 22. Alternatively, each circuit element 31 may be a single integrated circuit chip or a group of integrated circuit chips or a single electrical component or a group of electrical components that generate heat when functioning.

The circuit assembly 30 may include an X,Y board, an image processing board, and a switching mode power supply (SMPS) board. To cool the circuit assembly 30, elements such as heat pipes and heat sinks (not illustrated) are mounted to each board of the circuit assembly 30 so that heat generated during operation (or during functioning) is dissipated.

The PDP 20 and the chassis base 22 are mounted between and within the front cover 24 and the back cover 26 to thereby complete the formation of the plasma display device. A structure for dissipating heat generated by the circuit assembly 30 will now be described in detail.

It is well known that the circuit assembly 30 in a plasma display device generates heat during operation such that the air in the vicinity of the circuit assembly 30 is heated to very high temperatures. Although some of this heat is dissipated by a thermal conducting medium and cooling elements (such as the heat pipes and heat sinks), the heat-dissipating effect obtained from such elements is minimal. Therefore, this high temperature air rises upwardly (in an axis Y direction of FIG. 1 towards an upper edge of the plasma display device) as a result of the natural convection current characteristics.

The temperature of the air surrounding the circuit assembly 30 rises to high levels. In more detail, the air in the direct vicinity the SMPS board rises to approximately 90° C., while the air in the peripheries of the other boards increases to approximately 55° C.

Since heat is distributed differently for different areas of the chassis base 22, the present invention provides regulating members (or partitions or barriers or strips) 32, which are mounted to upper areas of the chassis base 22, that modifies the air temperature by forcing very hot air to mix with relatively cooler air before exiting from the inside of the plasma display panel. The regulating members 32 regulate the flow of air above each circuit element 31 of the circuit assembly 30.

Each regulating member 32 is mounted to the chassis base 30 at a predetermined distance from a corresponding circuit element 31 of the circuit assembly 30. In the first preferred embodiment of the present invention, one of the regulating members 32 is mounted for each circuit element 31 of the circuit assembly 30. As illustrated in FIG. 1, each regulating member 32 is arranged along the axis X direction above each circuit elements 31 of the circuit assembly 30 to force hot air rising in a +Y direction to move in a +/−X direction to mix with cooler air before emerging from the plasma display device.

Figure 2:
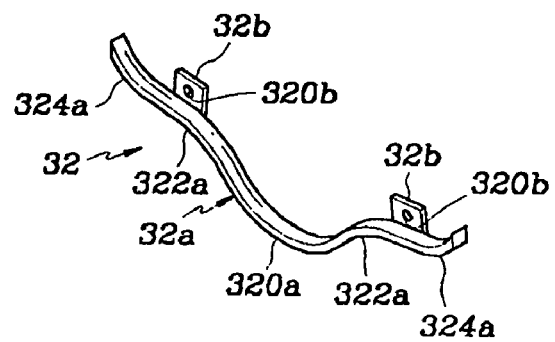
FIG. 2 is a perspective view of regulating members of FIG. 1.

With reference to FIG. 2, each of the regulating members 32 includes a main body 32a including a plurality of curves, and tabs 32b integrally formed to the main body 32a that are used to connect the regulating members 32 to the chassis base 22. The main body 32a is structured including at least one convex section 320a (convex from a location below the regulating member 32) and at least two concave sections 322a (concave from beneath the regulating member 32), which are integrally formed to form the main body 32a. In the first preferred embodiment of the present invention, one convex section 320a is positioned at a center of the main body 32a and one concave section 322a is provided to each side of the convex section 320a. Further, a sub convex section 324a is provided to an end of each of the two concave sections 322a. Inflection points are therefore formed on the regulating members 32 at locations between convex section 320a and the concave portions 322a. Inflection points also exist on the regulating members at points between the concave portions 322a and the sub convex portion 324a.

The concave and convex shapes of each regulating member 32 is based on the position of the same relative to the circuit assembly 30. In other words, when the regulating member 32 is attached to the chassis base, the convex section 320a is disposed directly above a center of a heat generating circuit element 31 of circuit assembly 30 to force rising hot air generated by the functioning element to divide and move sideways in a +/−X-direction to mix with relatively cooler air prior to emerging from the plasma display device. That is, in a state of being mounted to the chassis base 22, the convex section 320a of each of the regulating members 32 curves outwardly in a direction toward the element of the circuit assembly 30, and the concave sections 322a of each of the regulating members 32 curve inwardly away from the circuit element 31 of the circuit assembly 30. The sub convex sections 324a of each of the regulating members 32 also curve outwardly in a direction toward the circuit element 31 of the circuit assembly 30.

Figure 3:
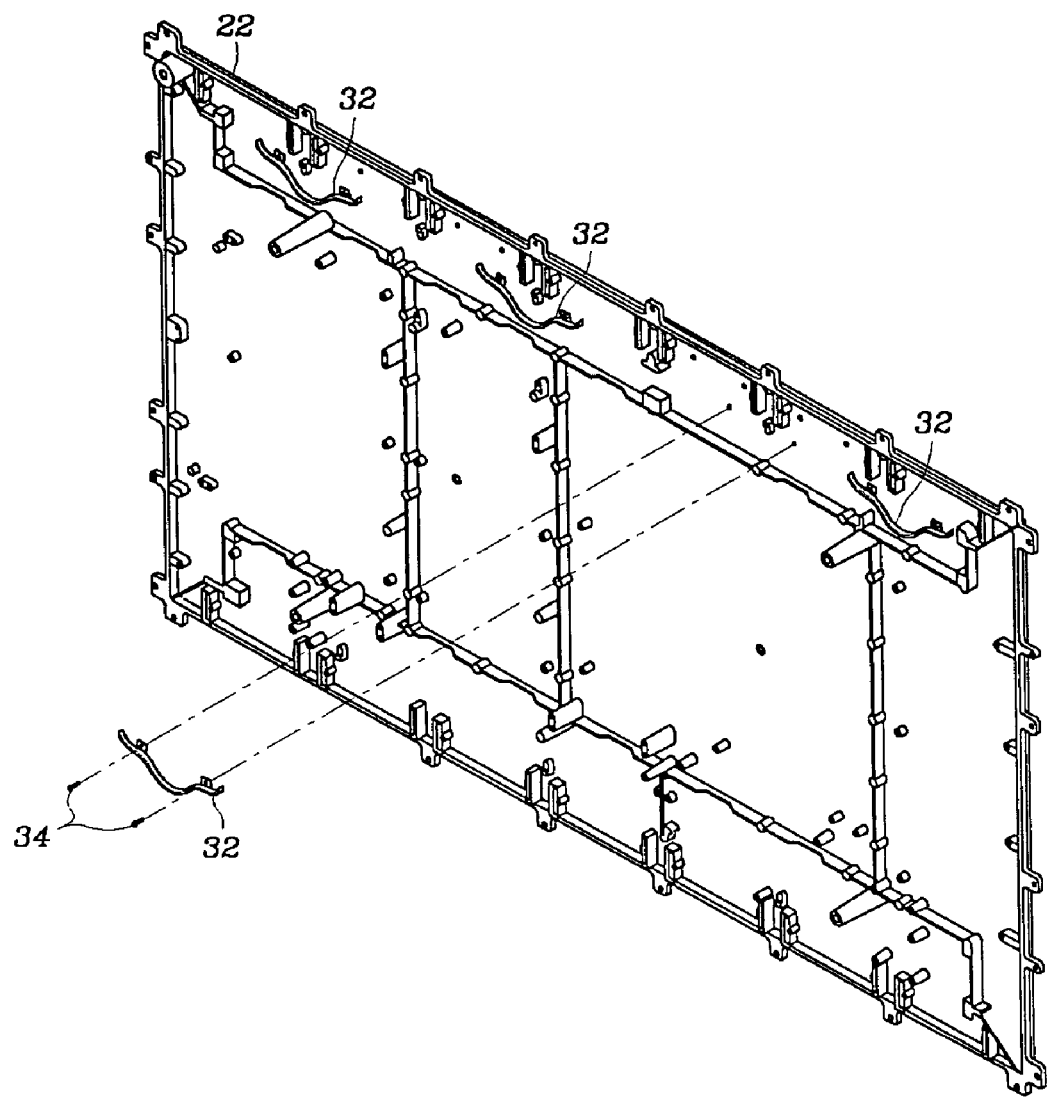
FIG. 3 is a perspective view of a chassis base of FIG. 1, and is used to describe a mounting of regulating members to the chassis base.

The tabs 32b are formed integrally to the main body 32a of each of the regulating members 32 as illustrated in FIG. 2. With reference also to FIG. 3, each of the tabs 32b includes holes 320b having threads, and screws 34 or other such fixing members are inserted into the holes 320b to fixedly mount the regulating members 32 to the chassis base 22. In the preferred embodiment of the present invention, a pair of the tabs 32b is provided for each regulating member 32 at predetermined locations of the main body 32a, that is, an equal predetermined distance from a center of the main body 32a. Although the regulating members 32 have been described as being screw-coupled to the chassis base 22, the present invention is not limited to such a configuration. For example, the regulating members 32 may be integrally formed to the chassis base 22.

Preferably, tabs 32b are perpendicular to main body 32a. When tabs 32b are attached to chassis base 22, main body 32a extends from chassis base 22 preferably in a direction that is normal to the rear surface of chassis base 22.

For the material used for the regulating members 32, it is preferable that the same material as used for the chassis base 22 be used, such as aluminum that has exceptional thermal conduction characteristics. Depending on the circumstances, a paper product such as corrugated cardboard may be used for the regulating members 32.

In the plasma display device having such regulating members 32, the temperature of the air distributed above the chassis base 22 is regulated and moderated such that the dissipation of heat is improved. This will be described with reference to FIG. 4.

During operation of a plasma display device absent any such regulating members 32, hot air of between 60 and 80° C. resulting from heat generated by the circuit assembly typically rises in the plasma display panel since it is less dense than the surrounding air (i.e., by convection). Since the hot air rises vertically, it does not sufficiently mix with the surrounding cool air in the absence of any regulating members. Therefore, the temperature of the air in the upper part of the back cover is unevenly distributed such that users may feel significant heat and may even be injured when handling the plasma display device.

Figure 4:
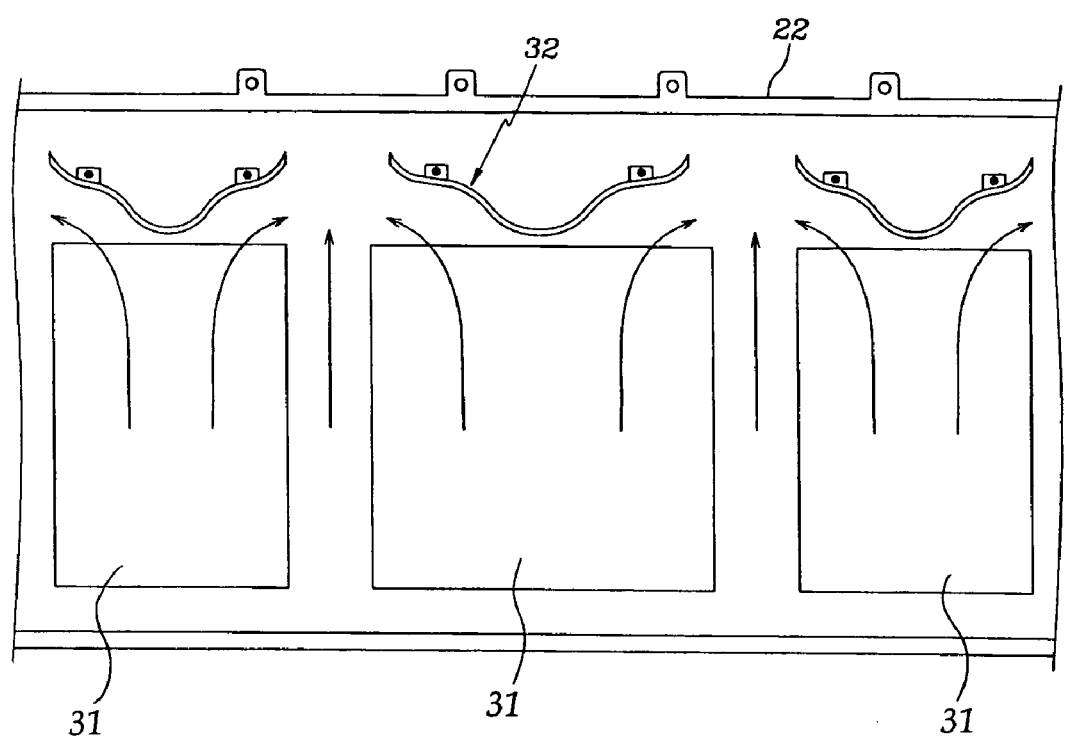
FIG. 4 is a drawing used to describe an operation of regulating members illustrated in FIG. 1.

As illustrated in FIG. 4, each regulating member 32 according to the first embodiment serves to force the most extreme hottest air rising from the corresponding circuit element 31 of the circuit assembly 30 toward areas that are not directly above a circuit element 31 of the circuit assembly 30 as illustrated by the arrows. The hot air then mixes with the cool air such that the heat at the top of the back cover 26 is more evenly distributed and is moderated. Therefore, when users makes contact with the top of the back cover 26, excessive heat that may cause injury is no longer a problem.

Figure 5:
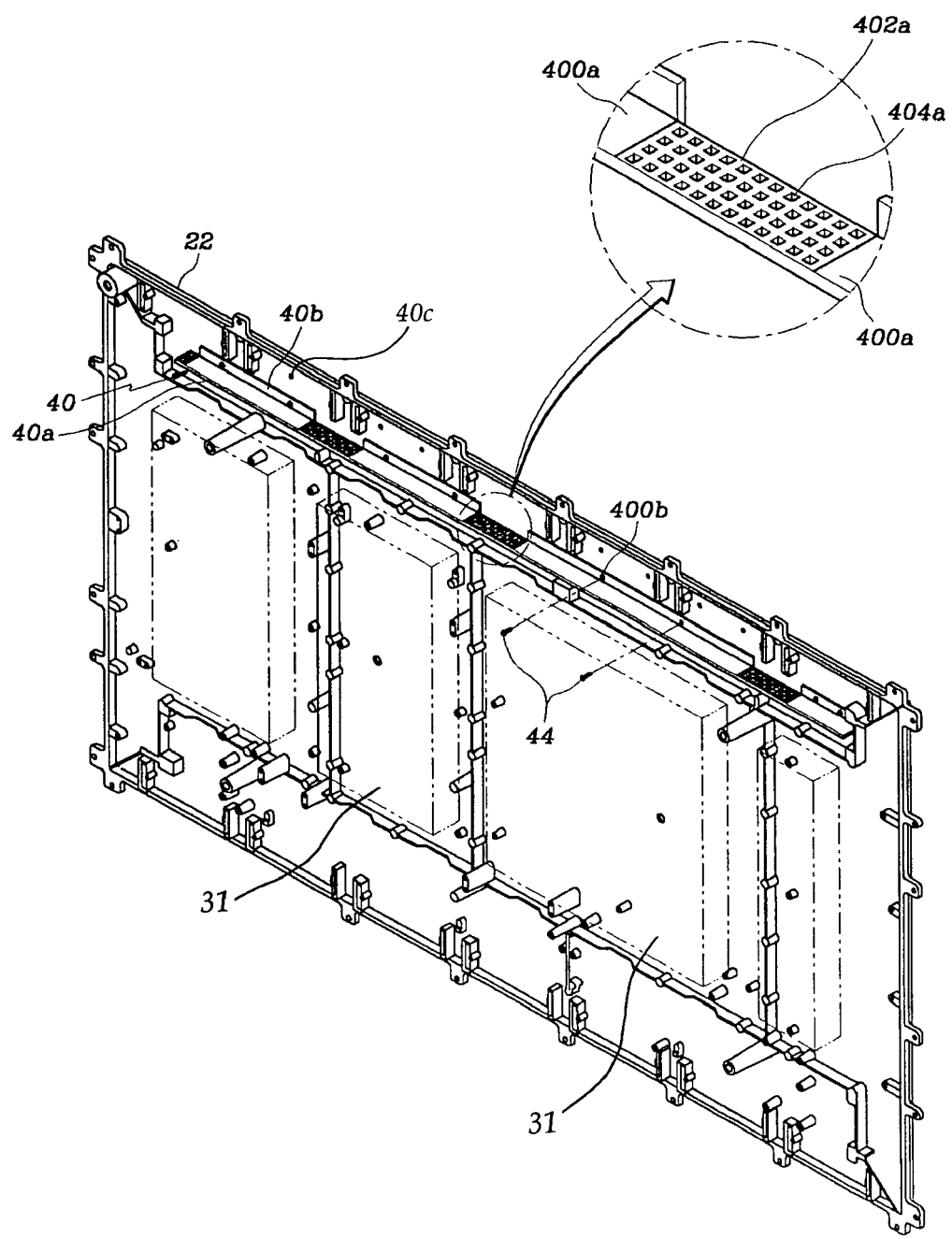
FIG. 5 is a perspective view of a chassis base according to a second preferred embodiment of the present invention, and is used to describe a mounting of a regulating member to the chassis base.

Additional preferred embodiments will now be described. FIG. 5 is a perspective view of a chassis base according to a second preferred embodiment of the present invention, and is used to describe a mounting of a regulating member to the chassis base. Like reference numerals for elements identical to those described with reference to the first preferred embodiment will be used.

As illustrated in FIG. 5, a regulating member 40 according to the second preferred embodiment of the present invention includes a main body 40a that is extended in the axis X direction, above a circuit assembly 30, and at a length sufficient to extend over the entire circuit assembly 30. Connecting members 40b are formed integrally to the main body 40a and enable regulating member 40 to be fixed to a chassis base 22. The regulating member 40 maintains a predetermined distance from the circuit assembly 30.

The main body 40a of the regulating member 40 includes non-aperture portions 400a corresponding to the locations directly above each heat producing circuit element 31 of the circuit assembly 30 and aperture portions 402a corresponding to the locations between adjoining circuit elements of the circuit assem 30. The connecting members 40b are integrally formed to the non-aperture portions 400a and include holes 40c having formed therein threads so that the regulating member 40 can be coupled to the chassis base 22 using screws 44.

The non-aperture portions 400a are substantially flat with no special features. The aperture portions 402a, on the other hand, include a plurality of apertures 404a through which air rising from a lower section of the chassis base 22 passes. It is preferable that the apertures 404a occupy 80% or more of an area of the aperture portions 402.

Figure 6:
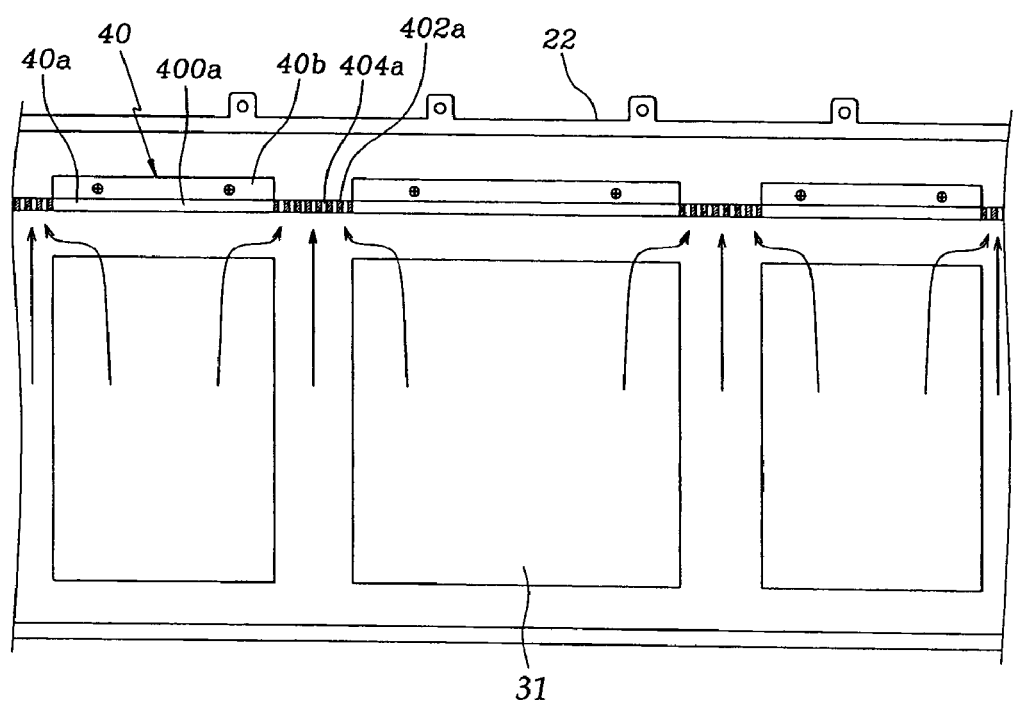
FIG. 6 is a drawing used to describe an operation of regulating members illustrated in FIG. 5.

As illustrated in FIG. 6, with the regulating member 40 structured as described above according to the second embodiment, hot air generated by circuit element 31 of the circuit assembly 30 during operation of the plasma display device rises vertically (+Y direction) to be blocked by the non-aperture portions 400a of the regulating member 40. As a result, the air is forced in a +/−X direction (sideways or laterally) toward the aperture portions 402a causing the hot air to mix with the relatively cool air in this area, then this mixed air passes through the apertures 404a. This results in a more even distribution of temperature at a top of a back cover 26 while preventing extreme heat from emerging at the top of the back cover 26.

Figure 7:
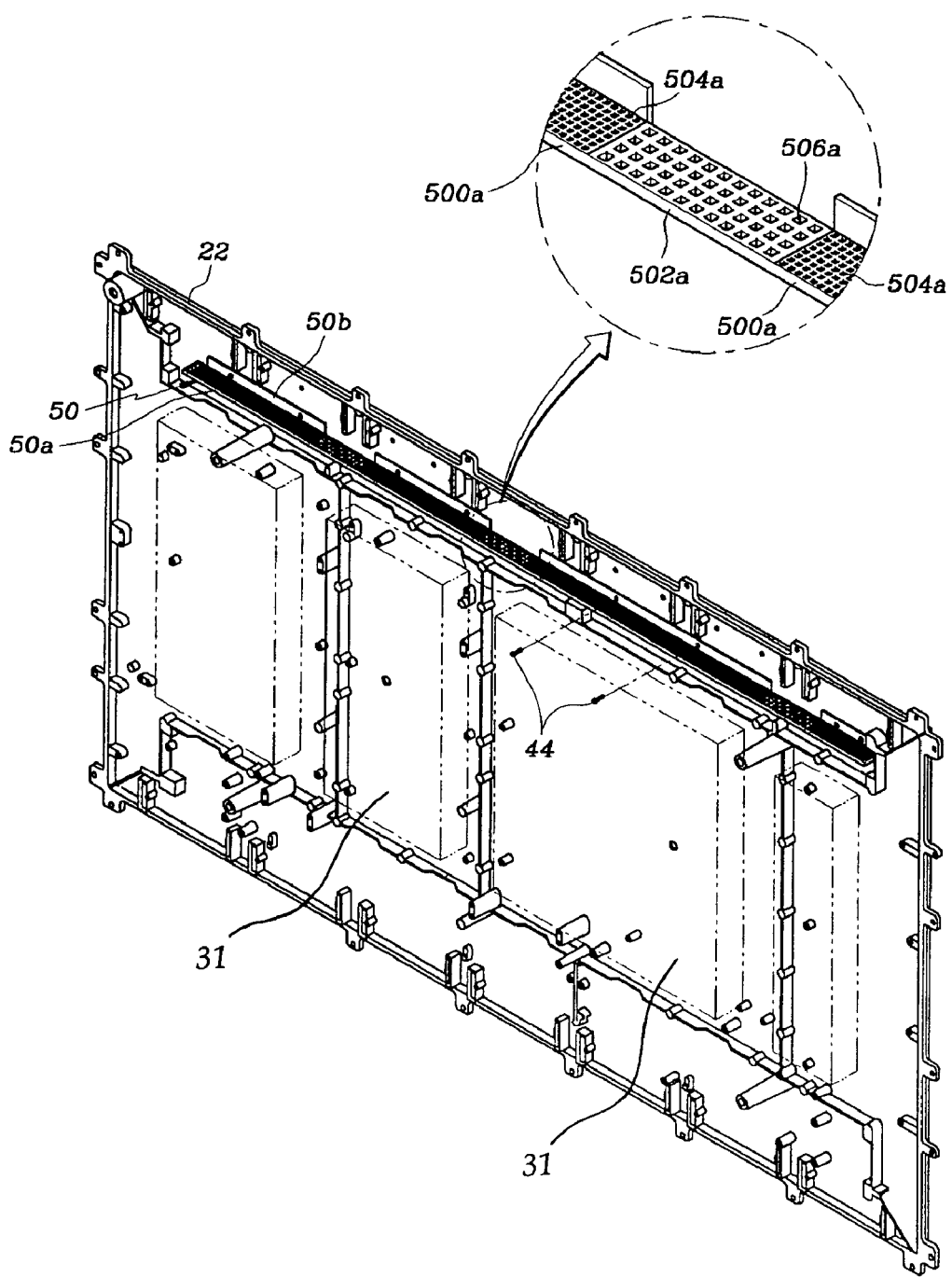
FIG. 7 is a perspective view of a chassis base according to a third preferred embodiment of the present invention, and is used to describe a mounting of a regulating member to the chassis base.

FIG. 7 is a perspective view of a chassis base according to a third preferred embodiment of the present invention. Like reference numerals for elements identical to those described with reference to the first preferred embodiment will be used. As illustrated in FIG. 7, a regulating member 50 includes a main body 50a and connecting members 50b, identical to the second preferred embodiment. However, the main body 50a is configured differently than main body 40a of the second embodiment in that the main body 50a of the third embodiment includes first aperture portions (or lightly perforated portions) 500a corresponding to locations over corresponding circuit elements of a circuit assembly 30, and second aperture portions (or heavily perforated portions) 502a corresponding to locations over areas between adjoining circuit elements of the circuit assembly 30. Accordingly, the main body 50a is formed with apertures over its entire surface.

In more detail, the first aperture portions 500a include first apertures 504a, and it is preferable that the first apertures 504a occupy less than 20% of a total area of the first aperture portions 500a. The second aperture portions 502a include second apertures 506a, and it is preferable that the second apertures 506a occupy 80% or more of a total area of the second aperture portions 502a.

Figure 8:
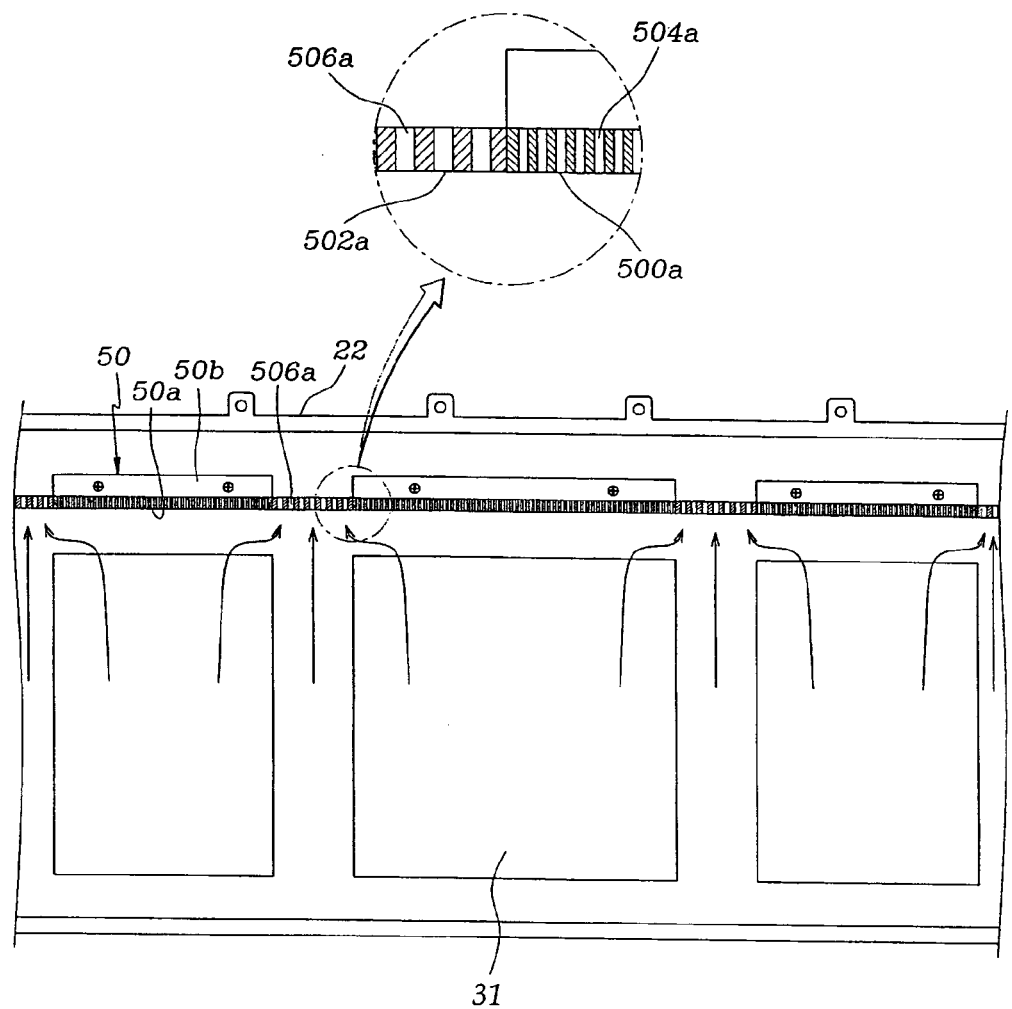
FIG. 8 is a drawing used to describe an operation of regulating members illustrated in FIG. 7.

Therefore, with reference to FIG. 8, the first aperture portions 500a are located over areas where there is a flow of hot air resulting from the generation of heat by circuit element 31 or elements of the circuit assembly 30, and the second aperture portions 502a are located over areas corresponding to between adjoining circuit elements of the circuit assembly 30 where there is a relatively cool flow of air. Since the first aperture portions 500a have an aperture ratio of less than 20%, most of the rising hot air does not pass through the aperture portions 500a and is instead induced toward the second aperture portions 502a. When forced towards the second aperture portions 502a, the hot air is moderated or cooled. With the aperture ratio of 80% or greater of the second aperture portions 502a, air is relatively easily passed through the second aperture portions 502a so that the hot air is mixed with the relatively cool air in this vicinity before passing through the second aperture portions 502a.

A speed at which the air passes through the second aperture portions 502a is between a rising speed of the hot air and a rising speed of cold air such that the rising of the cold air is, in effect, increased. Also, the first aperture portions 500a do not completely block the flow of hot air and the hot air passing therethrough mixes with itself This significantly reduces a maximum temperature of the hot air.

Figure 9:
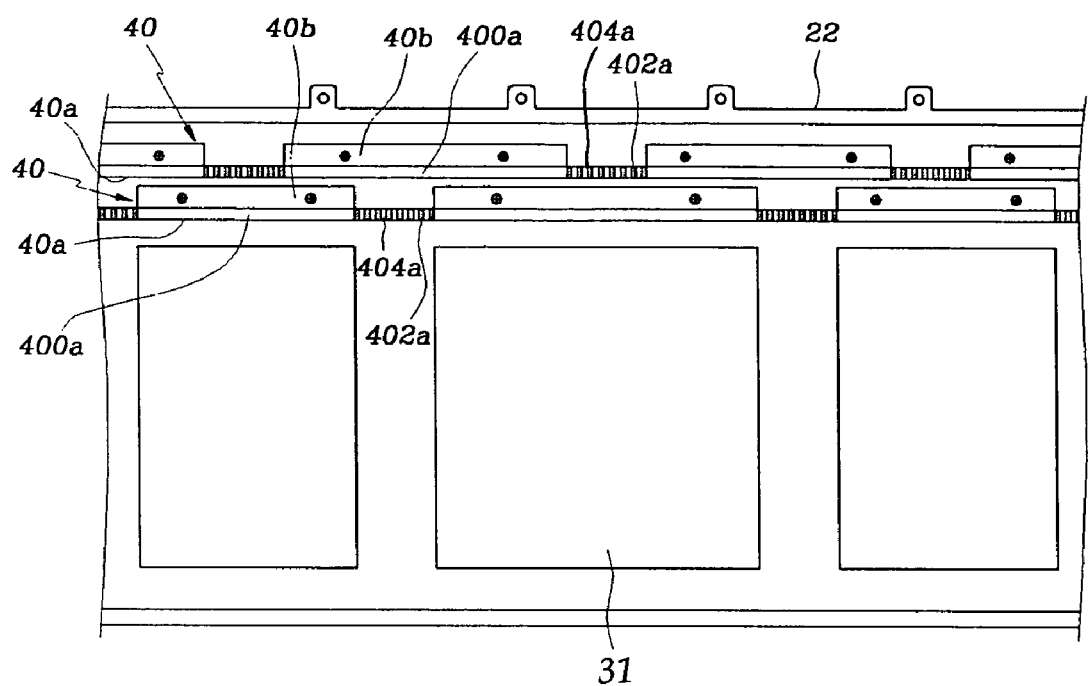
FIG. 9 is a drawing used to describe a fourth preferred embodiment of the present invention.
Figure 10:
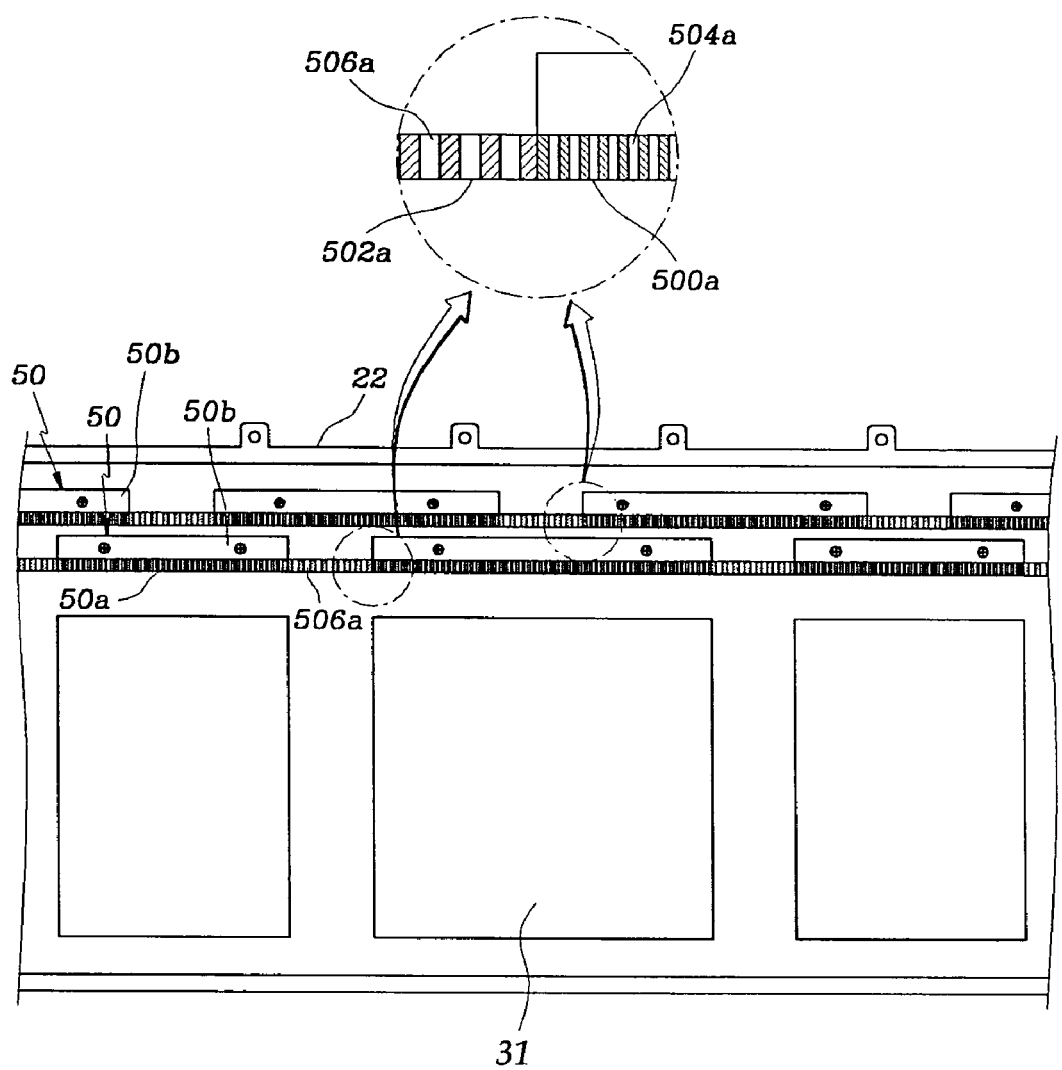
FIG. 10 is a drawing used to describe a fifth preferred embodiment of the present invention.

FIG. 9 is a drawing used to describe a fourth preferred embodiment of the present invention, and FIG. 10 is a drawing used to describe a fifth preferred embodiment of the present invention. With reference first to FIG. 9, the regulating member 40 is similar to the regulating member used in the second embodiment of the present invention. In the fourth embodiment of FIG. 9, there are provided two or more of the regulating members 40 layered one on top of the other, spaced apart from each other in the Y direction. With this configuration, the non-aperture portions 400a and the aperture portions 402a of each regulating member 40 are staggered from each other in the +/−X (or lateral)direction, that is, they are provided alternately in the axis X direction.

Similarly, as illustrated in FIG. 10, there are provided two or more of the regulating members 50 layered one on top of the other in the axis Y direction and with a predetermined distance therebetween. The regulating members used in the fifth embodiment of FIG. 10 are similar to the regulating members used in the third embodiment of the present invention. With this configuration, the first aperture portions 500a and the second aperture portions 500b of each regulating member 50 are staggered and unaligned from each other in the X direction, that is, they are provided alternately in the axis X direction.

With such a multi-layered configuration of FIGS. 9 and 10, the hot air has a chance to mix more thoroughly with cooler air so that moderation of the hot air is better achieved by the configurations of the fourth and fifth embodiments. In particular, the hot air is mixed with cool air at the first regulating member, then this process is repeated for each subsequent regulating member in the fourth and fifth embodiments. Therefore, the air is ultimately better cooled so that the temperature of the upper area of the back cover 26 is uniformly distributed to thereby prevent excessive temperatures in this region.

In the plasma display device of the present invention structured as in the above, a regulating member(s) is provided at upper areas of the chassis base such that the flow of air in this region is altered. As a result, the temperature of the air in this region is uniformly distributed to reduce the temperature at certain areas where it is prone to rise to excessive levels. Further, the regulating member(s) increase the overall strength of the device and prevent any bending of the same, thereby preventing damage to the PDP.

It is to be appreciated that features of various embodiments may be combined. For example, the curved regulating members of the first embodiment may have a perforation structure as in the second and third embodiments. Also, the curved structure of the regulating member of the first embodiment can be stacked up in different stages as in the fourth and fifth embodiments.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A plasma display device, comprising:
   a plasma display panel;
   a chassis base;
   a plurality of circuit elements arranged on the chassis base; and
   a plurality of regulating members arranged on a surface of the chassis base near corresponding ones of said plurality of circuit element, said regulating member each forming a partial barrier dividing a space within said plasma display device, wherein adjacent regulating members are separated from each other by a gap of a predetermined size, each of the plurality of regulating members corresponding to and being arranged above respective ones of a plurality of circuit elements, each of the plurality of regulating members comprises:
   a main body comprising a plurality of curves that are integrally combined, said main body extending from a surface of said chassis base to divide said space within said plasma display device; and
   tabs integrally formed to the main body, said tabs being formed parallel to said surface of said chassis base and being fixed to the chassis base, said main body forming an angle with said tabs.

2. The plasma display device of claim 1, each of the plurality of regulating members being screw-coupled to the chassis base using holes formed in the tabs.

3. A plasma display device, comprising:
a plasma display panel;
a chassis base;
a plurality of circuit elements arranged on the chassis base; and
a plurality of regulating members arranged on a surface of the chassis base near corresponding ones of said plurality of circuit elements, said regulating members each forming a partial barrier dividing a space within said plasma display device, wherein adjacent regulating members are separated from each other by a gap of a predetermined size, each of the plurality of regulating members corresponding to and being arranged above respective ones of a plurality of circuit elements, each of the of the plurality of regulating members comprises:
one or more convex section that curve in a direction toward the corresponding circuit element; and
two or more concave sections that curve in a direction away from the corresponding circuit element.

4. The plasma display device of claim 3, the convex section of the main body of each of the plurality of regulating members being at a center of each corresponding main body, and the concave section being disposed on opposite sides of the convex section, the convex section bulging towards a corresponding circuit element.

5. A plasma display device, comprising:
a plasma display panel;
a chassis base;
a plurality of circuit elements arranged on the chassis base; and
a regulating member arranged on a surface of the chassis base near one of said plurality of circuit elements, said regulating member forming a partial barrier dividing a space within said plasma display device, the regulating member being made of corrugated cardboard.

6. A plasma display device, comprising:
a plasma display panel;
a cassis base;
a plurality of circuit elements arranged on the chassis base; and
a regulating member arranged on a surface of the chassis base near one of said plurality of circuit elements, said regulating member forming a partial barrier dividing a space within said plasma display device, wherein the regulating member comprises:
a straight main body that extends in a lateral direction along a direction of a width of the chassis base corresponding to a width of the display; and
connecting members formed at an angle with the main body, the connecting members being formed in parallel and in contact with the chassis base, the main body comprises aperture and non aperture portions disposed alternately along said main body, wherein each non-aperture being disposed near a corresponding circuit element and each aperture portion being disposed near a space between two adjacent circuit elements.

7. The plasma display device of claim 6, wherein the main body is screw-coupled to the chassis base through holes formed in the connecting members.

8. The plasma display device of claim 6, wherein aperture formed in the aperture portions occupy 80% or more of a total area of the aperture portions.

9. The plasma display device of claim 6, said plasma display device comprising at least two regulating members, said regulating members being essentially parallel to each other and being staggered so that the aperture portions of one regulating member faces non-aperture portions of another adjacent regulating member and the aperture portions of said one regulating member faces non-aperture portions of said another adjacent regulating member.

10. A plasma display device, comprising:
a plasma display panel;
a chassis base;
a plurality of circuit elements arranged on the chassis base; and
a regulating member arranged on a surface of the chassis of the chassis base near corresponding ones of said plurality of circuit elements, said regulating member forming a partial barrier dividing a space within said plasma display device, wherein the regulating member comprises:
a straight, non-curved main body that extends along a direction of a width of the chassis base corresponding to a width of the display; and
connecting members formed integrally with and at an angle with main body, wherein the main body comprises first aperture portions formed with second aperture portions in an alternating manner, wherein the first aperture portions are disposed near corresponding ones of said plurality of circuit elements and said second aperture portions being disposed at locations corresponding to locations between a pair of adjacent circuit elements.

11. The plasma display device of claim 10, wherein apertures formed in the first aperture portions occupy less than 20% of a total area of the first aperture portions.

12. The plasma display device of claim 10, wherein apertures formed in the second aperture portions occupy 80% or more of a total area of the second aperture portions.

13. The plasma display device of claim 10, said plasma display device comprising at least two regulating members, said regulating members being essentially parallel to each other and being staggered so that the first aperture portions of one regulating member faces second aperture portions of another adjacent regulating member and second aperture portions of said one regulating member faces first aperture portions of said another adjacent regulating member.

14. A plasma display device, comprising:
a plasma display panel;
a chassis base arranged in a quadrilateral shape, the plasma display panel being supported by the chassis base on one side of the display panel;
a plurality of circuit elements arranged on a side of the chassis base opposite from the side of the chassis base that the plasma display panel is mounted, the circuit elements being arranged to apply electrical signals necessary for driving the plasma display panel; and
a regulating member arranged at an upper portion of the chassis base and near one of the plurality of circuit elements, the regulating member dividing a space within the plasma display device and being arranged in such a manner as to cause hot air rising from said plurality of circuit elements to move in a lateral direction perpendicular to a direction of rising hot air to a location within the plasma display device that is absent of the circuit elements prior to when said hot air emerges from said plasma display device, wherein the regulating member being a passive member and being curved, said regulating member being positioned within said plasma display device causing said rising hot air to divide in opposite lateral directions.

15. A plasma display device, comprising:

a plasma display panel;

a chassis base;

a plurality of circuit elements arranged on the chassis base; and at least one regulating member arranged on a surface of the chassis base near a corresponding one of said plurality of circuit elements, said at least one regulating member forming a partial barrier dividing a space within said plasma display device, the at least one regulating member being arranged on an upper area of the chassis base between a top of the display panel and the one of said plurality of circuit elements, the at least one regulating member comprises a curved section.

16. The plasma display device of claim 15, the curved section being convex and bulging towards said corresponding one of said plurality of circuit elements.

17. The plasma display device of claim 16, the at least one regulating member further comprising at least one concave curved section arranged at one side of the convex curved section.

18. The plasma display device of claim 15, the at least one regulating member comprising a plurality of regulating members, wherein adjacent regulating members being separated from each other by a gap.

19. The plasma display device of claim 18, each regulating member having concave curved sections on each side of the convex curved section.

20. The plasma display device of claim 19, each regulating member having straight sections on each side of the concave curved section.

21. The plasma display device of claim 18, each gap between adjoining regulating members corresponding to a gap between adjoining circuit elements.

* * * * *